US012610465B2

(12) United States Patent
Yokota

(10) Patent No.: US 12,610,465 B2
(45) Date of Patent: Apr. 21, 2026

(54) WIRING BOARD

(71) Applicant: SHINKO ELECTRIC INDUSTRIES CO., LTD., Nagano (JP)

(72) Inventor: Hiroshi Yokota, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 210 days.

(21) Appl. No.: 18/423,833

(22) Filed: Jan. 26, 2024

(65) Prior Publication Data

US 2024/0260187 A1 Aug. 1, 2024

(30) Foreign Application Priority Data

Feb. 1, 2023 (JP) ................................. 2023-014190

(51) Int. Cl.
*H05K 1/11* (2006.01)
*H05K 3/06* (2006.01)
*H05K 3/24* (2006.01)

(52) U.S. Cl.
CPC ............. *H05K 1/113* (2013.01); *H05K 3/062* (2013.01); *H05K 3/067* (2013.01); *H05K 3/244* (2013.01); *H05K 2201/0338* (2013.01); *H05K 2201/0347* (2013.01); *H05K 2201/099* (2013.01)

(58) Field of Classification Search
CPC ........ H05K 1/11; H05K 1/113; H05K 3/4007; H05K 1/114; H05K 2201/0338; H05K 2201/09472
USPC .......................................................... 174/250
See application file for complete search history.

(56) References Cited

U.S. PATENT DOCUMENTS 10,221,497 B2 * 3/2019 Noda ..................... C25D 5/022

FOREIGN PATENT DOCUMENTS

JP 2014-192205 10/2014

* cited by examiner

*Primary Examiner* — Tremesha W Burns
(74) *Attorney, Agent, or Firm* — IPUSA, PLLC

(57) ABSTRACT

A wiring board includes an insulating layer, first and second pads provided on the insulating layer and including a first surface in contact with the insulating layer, a second surface opposite to the first surface, and a side surface connecting the first and second surfaces, respectively, and a protective insulating layer provided above the insulating layer. The first and second pads have a portion exposed inside an opening in the protective insulating layer. The first pad has a portion opposing the second pad without the protective insulating layer interposed between the first and second pads. A region of the second surface of the first and second pads exposed from the protective insulating layer is covered with a plating layer. A region of the side surface of the first and second pads exposed from the protective insulating layer is exposed from the plating layer.

7 Claims, 11 Drawing Sheets

1B

1B

1C

1C

WIRING BOARD

CROSS-REFERENCE TO RELATED APPLICATIONS

This application is based upon and claims priority to Japanese Patent Application No. 2023-014190, filed on Feb. 1, 2023, the entire contents of which are incorporated herein by reference.

FIELD

Certain aspects of the embodiments discussed herein are related to wiring boards, and methods for forming the wiring boards.

BACKGROUND

A known configuration of a wiring board includes a protective insulating layer having openings, and a plurality of pads for external connection exposed via the openings of the protective insulating layer. The external connection pads include solder mask defined (SMD) pads or non-solder mask defined (NSMD) pads, and both the SMD pads and the NSMD pads may coexist as the external connection pads. In such a wiring board, a plating layer is formed to cover upper and the surfaces of the NSMD pads, for example. An example of such a wiring board is proposed in Japanese Laid-Open Patent Publication No. 2014-192205, for example.

However, when an interval between adjacent pads becomes narrow, it may not be possible to dispose the protective insulating layer between the adjacent pads. In such a case, the plating layer formed on the side surface of the adjacent pad extends to an upper surface of the protective insulating layer, thereby substantially narrowing the interval between the adjacent pads, and consequently deteriorate a highly accelerated temperature and humidity stress test (HAST) resistance.

SUMMARY

Accordingly, it is an object in one aspect of the embodiments to improve the HAST resistance of the wiring board.

According to one aspect of the embodiments, a wiring board includes an insulating layer; a first pad and a second pad for external connection, provided on the insulating layer and including a first surface in contact with the insulating layer, a second surface opposite to the first surface, and a side surface connecting the first surface and the second surface, respectively; and a protective insulating layer provided above the insulating layer, wherein each of the first pad and the second pad has a portion exposed inside an opening in the protective insulating layer, the first pad has a portion opposing the second pad without the protective insulating layer interposed between the opposing portion of the first pad and the second pad, a region of the second surface of each of the first pad and the second pad exposed from the protective insulating layer is covered with a plating layer, and a region of the side surface of each of the first pad and the second pad exposed from the protective insulating layer is exposed from the plating layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
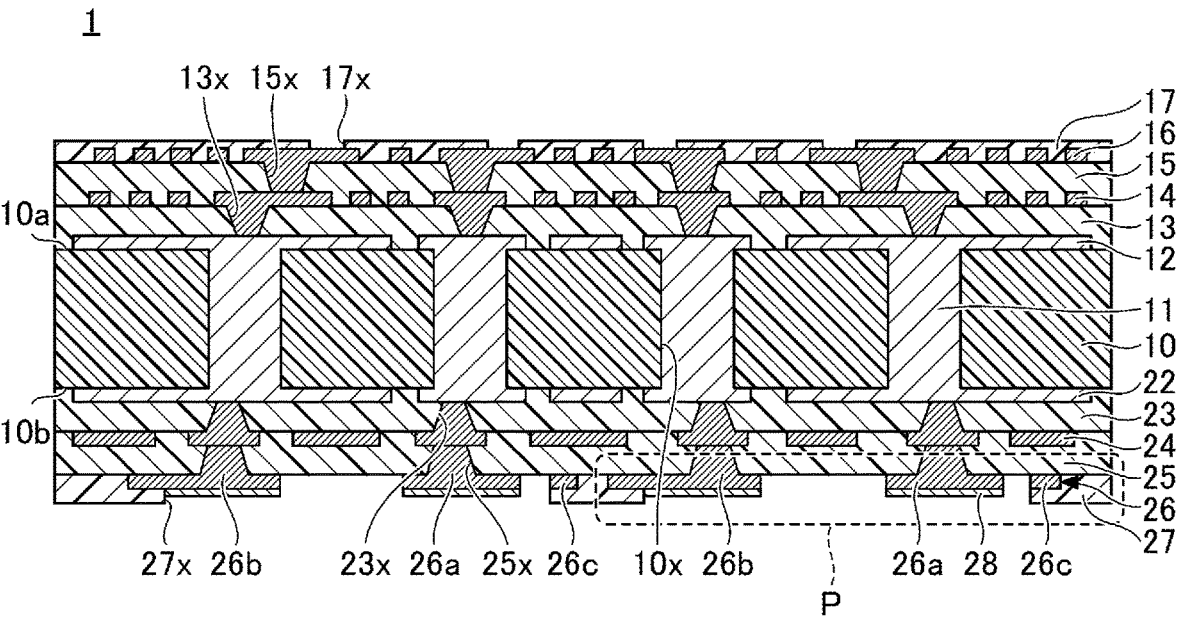
FIG. 1A and FIG. 1B are diagrams illustrating an example of a wiring board according to a first embodiment.

Hereinafter, embodiments of the present disclosure will be described with reference to the drawings. In the drawings, those constituent elements that are the same are designated by the same reference numerals, and a repeated description of the same constituent elements may be omitted.

First Embodiment

[Configuration of Wiring Board]

Figure 1B:
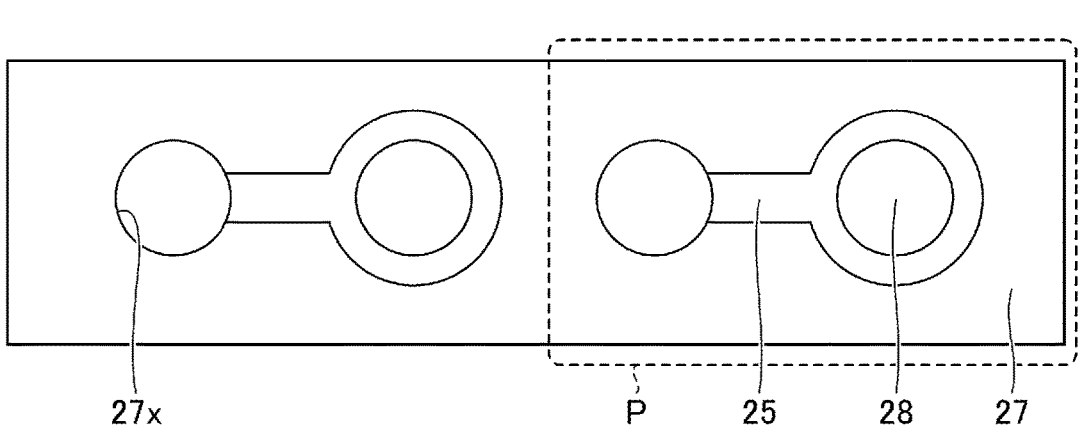

FIG. 1A and FIG. 1B are diagrams illustrating an example of a wiring board according to a first embodiment. FIG. 1A is a cross sectional view illustrating the entire wiring board, and FIG. 1B is a partial bottom view of a region P and a vicinity thereof in FIG. 1A.

As illustrated in FIG. 1A and FIG. 1B, a wiring board 1 includes interconnect layers and insulating layers are laminated on both mutually opposite surfaces of a core layer 10.

More particularly, in the wiring board 1, an interconnect layer 12, an insulating layer 13, an interconnect layer 14, an insulating layer 15, an interconnect layer 16, and a solder resist layer 17 are successively laminated on one surface 10*a* of the core layer 10. In addition, an interconnect layer 22, an insulating layer 23, an interconnect layer 24, an insulating layer 25, an interconnect layer 26, a solder resist layer 27, and a plating layer 28 are successively laminated on the other surface 10b of the core layer 10.

In the first embodiment, for the sake of convenience, the side of the wiring board 1 provided with the solder resist layer 17 is referred to as an upper side or one side, and the side of the wiring board 1 provided with the solder resist layer 27 is referred to as a lower side or the other side. The surface of each portion on the side of the wiring board 1 provided with the solder resist layer 17 is referred to as one surface or an upper surface, and the surface of each portion on the side of the wiring board 1 provided with the solder resist layer 27 is referred to as the other surface or a lower surface. However, the wiring board 1 can be used in an upside-down state, or can be arranged at an arbitrary angle. Further, a plan view of an object refers to a view of the object viewed from above in a normal direction to the one surface 10a of the core layer 10, and a planar shape of the object indicates a shape of the object in the plan view viewed from above in the normal direction to the one surface 10a of the core layer 10.

The core layer 10 may be a so-called glass epoxy substrate or the like having a glass cloth impregnated with an insulating resin, such as an epoxy-based resin or the like, for example. The core layer 10 may be a substrate or the like having a woven or nonwoven fabric of glass fiber, carbon fiber, aramid fiber, or the like impregnated with an epoxy-based resin or the like. A thickness of the core layer 10 is in a range of approximately 60 µm to approximately 1000 µm, for example. The core layer 10 is has via holes (or through holes) 10x penetrating the core layer 10 in a thickness direction thereof. A planar shape of the via hole 10x is a circular shape, for example.

The interconnect layer 12 is formed on the one surface 10a of the core layer 10. On the other hand, the interconnect layer 22 is formed on the other surface 10b of the core layer 10. The interconnect layer 12 and the interconnect layer 22 are electrically connected to each other through via interconnects 11 formed inside the via holes 10x. The interconnect layers 12 and 22 are patterned into predetermined planar shapes, respectively. A material used for the interconnect layers 12 and 22 and the via interconnects 11 may be copper (Cu) or the like, for example. A thickness of the interconnect layers 12 and 22 is in a range of approximately 10 µm to approximately 40 µm, for example. The interconnect layer 12, the interconnect layer 22, and the via interconnects 11 may be formed integrally.

The insulating layer 13 is an interlayer insulator formed on the one surface 10a of the core layer 10, so as to cover the interconnect layer 12. A material used for the insulating layer 13 may be a non-photosensitive thermosetting resin including an epoxy resin or the like as a main component thereof, for example. A thickness of the insulating layer 13 is in a range of approximately 25 µm to approximately 40 µm, for example. The insulating layer 13 may include a filler, such as silica ($SiO_2$) or the like. The insulating layer 13 includes via holes 13x penetrating the insulating layer 13 in the thickness direction thereof, and expose an upper surface of the interconnect layer 12. The via hole 13x may be a cavity having an inverted truncated cone shape, and a diameter of a first opening of the cavity at one end which opens toward the insulating layer 15 is greater than a diameter of a second opening of the cavity at the other end, at a bottom surface of the cavity, formed by the upper surface of the interconnect layer 12.

The interconnect layer 14 fills the via holes 13x and is electrically connected to the interconnect layer 12. The interconnect layer 14 extends from inside the via holes 13x to an upper surface of the insulating layer 13. More particularly, the interconnect layer 14 includes via interconnects filling the via holes 13x, and an interconnect pattern formed on the upper surface of the insulating layer 13. The interconnect pattern of the interconnect layer 14 is electrically connected to the interconnect layer 12 through the via interconnects filling the via holes 13x. A material used for the interconnect layer 14 and a thickness of the interconnect pattern of the interconnect layer 14 are the same as those of the interconnect layer 12, for example.

The insulating layer 15 is formed on the upper surface of the insulating layer 13, so as to cover the interconnect layer 14. A material used for the insulating layer 15 and a thickness of the insulating layer 15 are the same as those of the insulating layer 13, for example. The insulating layer 15 may include a filler, such as silica ($SiO_2$) or the like. The insulating layer 15 includes via holes 15x penetrating the insulating layer 15 in the thickness direction thereof, and expose an upper surface of the interconnect layer 14. The via hole 15x may be a cavity having an inverted truncated cone shape, and a diameter of a first opening of the cavity at one end which opens toward the solder resist layer 17 is greater than a diameter of a second opening of the cavity at the other end, at a bottom surface of the cavity, formed by the upper surface of the interconnect layer 14.

The interconnect layer 16 fills the via holes 15x, and is electrically connected to the interconnect layer 14. The interconnect layer 16 extends from inside the via holes 15x to an upper surface of the insulating layer 15. More particularly, the interconnect layer 16 includes via interconnects filling the via holes 15x, and an interconnect pattern formed on the upper surface of the insulating layer 15. The interconnect pattern of the interconnect layer 16 is electrically connected to the interconnect layer 14 through the via interconnects filling the via holes 15x. A material used for the interconnect layer 16 and a thickness of the interconnect pattern of the interconnect layer 16 are the same as those of the interconnect layer 12, for example.

The solder resist layer 17 is a protective insulating layer located at an outermost position on one side of the wiring board 1. The solder resist layer 17 is formed on the upper surface of the insulating layer 15, so as to cover the interconnect layer 16. The solder resist layer 17 includes openings 17x, and portions of the upper surface of the interconnect layer 16 are exposed inside the openings 17x. A planar shape of the opening 17x is a circular shape, for example. The interconnect layer 16 exposed inside the opening 17x can be used as a pad for making an electrical connection to a semiconductor chip or the like. A material used for the solder resist layer 17 may be a photosensitive insulating resin including a phenol-based resin, a polyimide-based resin, or the like as a main component thereof, for example. The solder resist layer 17 may include a filler, such as silica ($SiO_2$). A thickness of the solder resist layer 17 is in a range of approximately 25 µm to approximately 40 µm, for example.

A surface-treated layer (not illustrated) may be formed on the upper surface of the interconnect layer 16 exposed inside the openings 17x. Examples of the surface-treated layer include a Au layer, a Ni/Au layer (a metal layer in which a Ni layer and a Au layer are laminated in this order), a Ni/Pd/Au layer (a metal layer in which a Ni layer, a Pd layer, and a Au layer are laminated in this order), or the like, for example. In addition, the surface-treated layer may be formed on the upper surface of the interconnect layer 16 exposed inside the openings 17x by performing an anti-oxidation process, such as an organic solderability preservative (OSP) treatment or the like. By performing the OSP treatment, an organic coating film formed of an azole compound, an imidazole compound, or the like can be formed as the surface-treated layer. Moreover, protruding electrodes (not illustrated), such as metal posts or the like, may be formed on the upper surface of the interconnect layer 16 exposed inside the openings 17*x*.

The insulating layer 23 is an interlayer insulator formed on the other surface 10*b* of the core layer 10, so as to cover the interconnect layer 22. A material used for the insulating layer 23 and a thickness of the insulating layer 23 are the same as those of the insulating layer 13, for example. The insulating layer 23 may include a filler, such as silica ($SiO_2$) or the like. The insulating layer 23 includes via holes 23*x* penetrating the insulating layer 23 in the thickness direction thereof, and exposing a lower surface of the interconnect layer 22. The via hole 23*x* may be a cavity having a truncated cone shape, and a diameter of a first opening of the cavity at one end which opens toward the insulating layer 25 is greater than a diameter of a second opening of the cavity at the other end, at a bottom surface of the cavity, formed by the lower surface of the interconnect layer 22.

The interconnect layer 24 fills the via holes 23*x*, and is electrically connected to the interconnect layer 22. The interconnect layer 24 extends from inside the via holes 23*x* to a lower surface of the insulating layer 23. More particularly, the interconnect layer 24 includes via interconnects filling the via holes 23*x*, and an interconnect pattern formed on the lower surface of the insulating layer 23. The interconnect pattern of the interconnect layer 24 is electrically connected to the interconnect layer 22 through the via interconnects filling the via holes 23*x*. A material used for the interconnect layer 24 and a thickness of the interconnect pattern are the same as those of the interconnect layer 12, for example.

The insulating layer 25 is an interlayer insulator formed on the lower surface of the insulating layer 23, so as to cover the interconnect layer 24. A material used for the insulating layer 25 and a thickness of the insulating layer 25 are the same as those of the insulating layer 13, for example. The insulating layer 25 may include a filler, such as silica ($SiO_2$) or the like. The insulating layer 25 includes via holes 25*x* penetrating the insulating layer 25 in the thickness direction thereof, and expose the lower surface of the interconnect layer 24. The via hole 25*x* may be a cavity having a truncated cone shape, and a diameter of a first opening of the cavity at one end which opens toward the solder resist layer 27 is greater than a diameter of a second opening of the cavity at the other end, at a bottom surface of the cavity, formed by the lower surface of the interconnect layer 24.

The interconnect layer 26 fills the via holes 25*x*, and is electrically connected to the interconnect layer 24. The interconnect layer 26 extends from the inside of the via holes 25*x* to the lower surface of the insulating layer 25. More particularly, the interconnect layer 26 includes via interconnects filling the via holes 25*x*, and pads and interconnects formed on the lower surface of the insulating layer 25. The pads and the interconnects of the interconnect layer 26 are electrically connected to the interconnect layer 24 through the via interconnects filling the via holes 25*x*. A material used for the interconnect layer 26 and a thickness of the pads and the interconnects are the same as those of the interconnect layer 12, for example.

The solder resist layer 27 is a protective insulating layer located at an outermost position on the other side of the wiring board 1. The solder resist layer 27 is formed on the lower surface of the insulating layer 25. The solder resist layer 27 includes openings 27*x*, and portions of the lower surface of the interconnect layer 26 are exposed inside the openings 27*x*. A material used for the solder resist layer 27 may be a photosensitive insulating resin including a phenol-based resin, a polyimide-based resin, or the like as a main component thereof, for example. The solder resist layer 27 may include a filler, such as silica ($SiO_2$) or the like. A thickness of the solder resist layer 27 with respect to the lower surface of the insulating layer 25 is in a range of approximately 30 μm to approximately 45 μm, for example. The thickness of the solder resist layer 27 with respect to the lower surface of the interconnect layer 26 is in a range of approximately 15 μm to approximately 30 μm, for example.

A plating layer 28 is formed on the lower surface of the interconnect layer 26 exposed inside the openings 27*x* of the solder resist layer 27. The plating layer 28 may be a single-layer metal layer or a multi-layer metal layer described above as examples of the surface-treated layer. A thickness of the plating layer 28 may be in a range of approximately 5 μm to approximately 10 μm, for example.

Next, the interconnect layer 26, the solder resist layer 27, and the plating layer 28 will be described in more detail. The interconnect layer 26 includes first pads 26*a* having a non-solder mask defined (NSMD) structure, and seconds pad 26*b* having a solder mask defined (SMD) structure. A lower surface and a side surface of the first pad 26*a* are entirely exposed from the solder resist layer 27. A lower surface and a side surface of the second pad 26*b* are partially covered with the solder resist layer 27.

The interconnect layer 26 may include an interconnect 26*c*, that is formed on the same surface of the insulating layer 25 as the first pads 26*a* and the second pads 26*b*, and includes portions exposed from an inner wall surface defining the openings 27*x* of the solder resist layer 27. In addition, the interconnect layer 26 may include an interconnect (not illustrated) electrically connected to the first pads 26*a* and/or the second pads 26*b*. An entirety of an interconnect, other than the interconnect located at the illustrated position, may be covered with the solder resist layer 27.

For example, the first pad 26*a* is a signal pad, and the second pad 26*b* is a power supply or ground pad. In this case, the interconnect connected to the second pad 26*b* can be made wider than the interconnect connected to the first pad 26*a* in the plan view. The interconnect connected to the second pad 26*b* may be an approximately solid interconnect layer.

The first pads 26*a* and the second pads 26*b* are provided on the insulating layer 25, and each of the first and second pads 26*a* and 26*b* includes a first surface in contact with the insulating layer 25, a second surface opposite to the first surface, and a side surface connecting the first surface and the second surface. In the example illustrated in FIG. 1A and FIG. 1B, the upper surface of each of the first and second pads 26*a* and 26*b* is the first surface, and the lower surface of each of the first and second pads 26*a* and 26*b* is the second surface. Each of the first and second pads 26*a* and 26*b* has portions exposed inside the openings 27*x* of the solder resist layer 27.

The first pad 26*a* and the second pad 26*b* exposed inside the openings 27*x* have a planar shape that is a circular shape in the plan view, for example. In this case, diameters of the first pad 26*a* and the second pad 26*b* exposed inside the openings 27*x* may be in a range of approximately 300 μm to approximately 1000 μm, for example. The diameters of the first pad 26*a* and the second pad 26*b* may be the same, or may be different. A distance between adjacent first and second pads 26*a* and 26*b* may be in a range of approximately 50 μm to approximately 150 μm, for example. However, the first and second pads 26a and 26b exposed inside the openings 27x may have a planar shape other than a circular shape, such as a polygonal shape including a rectangular shape or the like, an elliptical shape, or the like in the plan view, for example. The first and second pads 26a and 26b exposed inside the openings 27x can be used as external connection pads for making electrical connections to a mounting board, such as a mother board or the like.

The first pad 26a has a portion opposing the second pad 26b, without the solder resist layer 27 interposed between the opposing portion of the first pad 26a and the second pad 26b. For example, the solder resist layer 27 is not disposed at the portion between the first pad 26a and the second pad 26b where the first pad 26a and the second pad 26b are located closest to each other in the plan view. The plating layer 28 covers regions of the second surfaces (lower surfaces) of the first pad 26a and the second pad 26b that are exposed from the solder resist layer 27. Regions of the side surfaces of the first pad 26a and the second pad 26b, exposed from the solder resist layer 27, are not covered with the plating layer 28 and are exposed from the plating layer 28.

The inner wall surface of the openings 27x of the solder resist layer 27 is separated from the insulating layer 25. That is, the inner wall surface of the openings 27x of the solder resist layer 27 does not make contact with the upper surface of the insulating layer 25. The inner wall surface of the openings 27x of the solder resist layer 27 makes contact with the second surface (lower surface) of at least one of the first pad 26a, the second pad 26b, or the interconnect 26c. The inner wall surface of the openings 27x of the solder resist layer 27 may include a portion that makes contact with a side surface of the plating layer 28. The inner wall surface of the openings 27x of the solder resist layer 27 may include a portion that coincides with a side surface of the interconnect 26c.

As will be described later, because the first pad 26a and the second pad 26b are formed by etching, the side surface of each of the first and second pads 26a and 26b may not be perpendicular with respect to the lower surface of the insulating layer 25, and thus, the side surface of each of the first and second pads 26a and 26b may be inclined from the perpendicular state with respect to the lower surface of the insulating layer 25. For example, the first pad 26a may have a trapezoidal shape in which a length of the second surface (lower surface) is shorter than a length of the first surface (upper surface) in the cross sectional view illustrated in FIG. 1A. A difference between the length of the second surface (lower surface) and the length of the first surface (upper surface) of the first pad 26a may be approximately several μm, for example.

[Method For Manufacturing Wiring Board]

FIG. 2A through FIG. 7B are diagrams illustrating an example of manufacturing processes of the wiring board according to the first embodiment. In FIG. 2A through FIG. 7B, the wiring board is illustrated in an upside-down state from the state illustrated in FIG. 1A and FIG. 1B. FIG. 2A, FIG. 3A, FIG. 4A, FIG. 5A, FIG. 6A, and FIG. 7A illustrate plan views corresponding to a region P in FIG. 1A and FIG. 1B. FIG. 2B, FIG. 3B, FIG. 4B, FIG. 5B, FIG. 6B, and FIG. 7B illustrate cross sectional views taken along a line A-A in FIG. 2A, FIG. 3A, FIG. 4A, FIG. 5A, FIG. 6A, and FIG. 7A, respectively. Although FIG. 2A, FIG. 3A, FIG. 4A, FIG. 5A, FIG. 6A, and FIG. 7A are plan views, hatchings corresponding to the cross sectional views of FIG. 2B, FIG. 3B, FIG. 4B, FIG. 5B, FIG. 6B, and FIG. 7B are illustrated for the sake of convenience to facilitate understanding of corresponding constituent elements.

The wiring board 1 illustrated in FIG. 1A and FIG. 1B can be manufactured by successively laminating interconnect layers and insulating layers on the one surface 10a and the other surface 10b of the core layer 10 by the well known build-up method, for example. In this example, the processes (or steps) of forming the interconnect layer 26, the solder resist layer 27, and the plating layer 28 on the wiring board already having the insulating layer 25 laminated thereon, will be described in conjunction with the illustration of the region P.

Figure 2A:
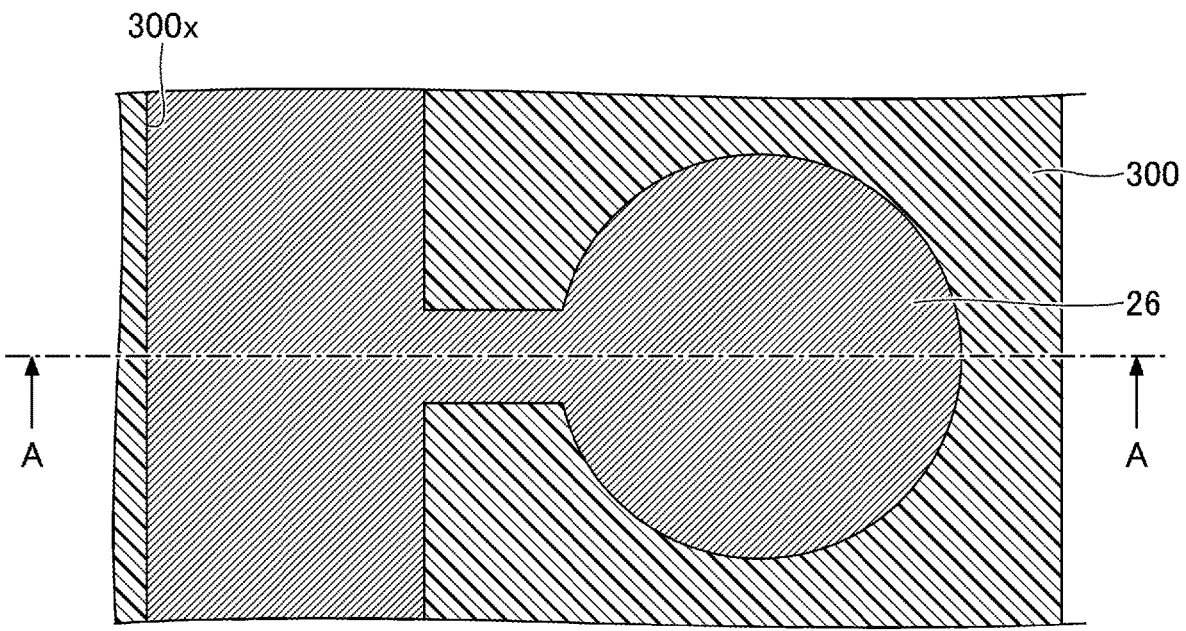
FIG. 2A and FIG. 2B are diagrams (part 1) illustrating an example of manufacturing processes of the wiring board according to the first embodiment.
Figure 2B:
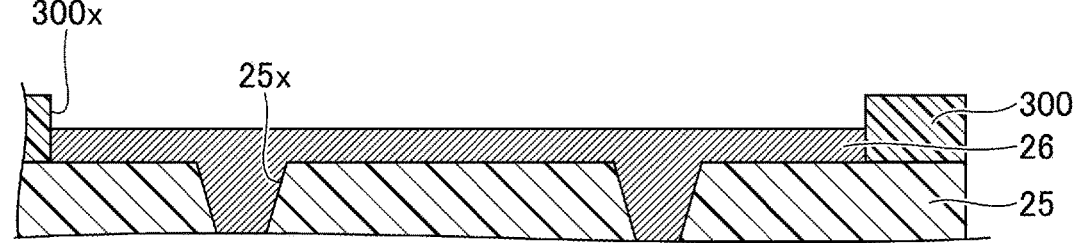

First, in the process (or step) illustrated in FIG. 2A and FIG. 2B, after the via holes 25x are formed in the insulating layer 25, the interconnect layer 26 is formed on the insulating layer 25. The via holes 25x can be formed by a laser beam machining using a $CO_2$ laser or the like, for example. After the via holes 25x are formed, a resist layer 300 having holes 300x that expose regions where the interconnect layer 26 is to be formed, is formed on the upper surface of the insulating layer 25. The resist layer 300 can be formed by attaching a photosensitive dry film resist onto the insulating layer 25, for example. The holes 300x can be formed by exposing and developing the photosensitive dry film resist, for example. The interconnect layer 26 can be formed inside the via holes 25x and on the upper surface of the insulating layer 25 exposed inside the holes 300x, by a known semi-additive method, for example. The interconnect layer 26 includes a first surface in contact with the insulating layer 25, and a second surface opposite to the first surface. In this example, the first surface of the interconnect layer 26 is the lower surface thereof, and the second surface of the interconnect layer 26 is the upper surface thereof.

Figure 3A:
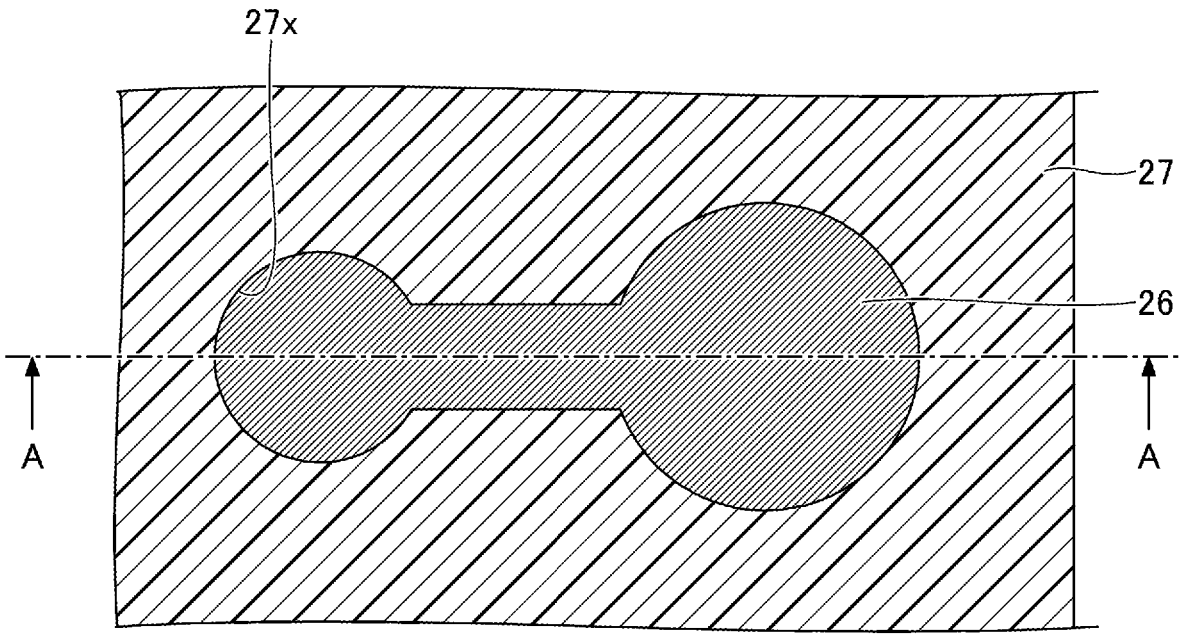
FIG. 3A and FIG. 3B are diagrams (part 2) illustrating an example of the manufacturing processes of the wiring board according to the first embodiment.
Figure 3B:
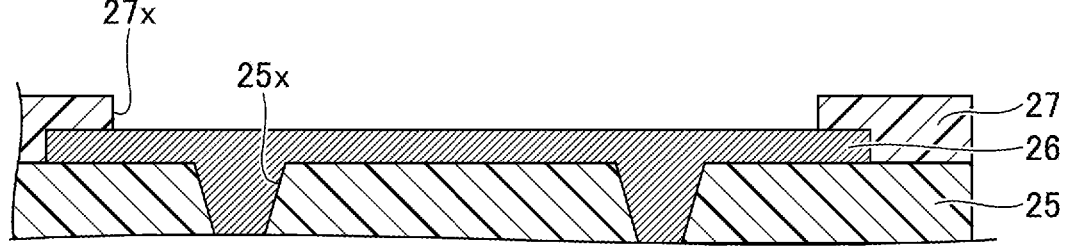

Next, in a process (or step) illustrated in FIG. 3A and FIG. 3B, after the resist layer 300 is removed, the solder resist layer 27 including the openings 27x that selectively expose the second surface (upper surface) of the interconnect layer 26, is formed on the insulating layer 25. The solder resist layer 27 can be formed by coating a liquid or paste of a photosensitive epoxy-based insulating resin on the upper surface of the insulating layer 25 by screen printing, roll coating, spin coating, or the like, for example, so as to cover the interconnect layer 26. Alternatively, a photosensitive epoxy-based insulating resin film can be laminated on the upper surface of the insulating layer 25, for example, so as to cover the interconnect layer 26. The openings 27x can be formed by exposing and developing the solder resist layer 27, for example.

Next, in the processes (or steps) illustrated in FIG. 4A through FIG. 6B, the plating layer 28 is formed on mutually independent first and second regions of the second surface (upper surface) of the interconnect layer 26 exposed inside the openings 27x of the solder resist layer 27. Although the plating layer 28 is formed in the first and second regions in this example, the plating layer 28 may be formed in three or more regions that are independent of one another.

Figure 4A:
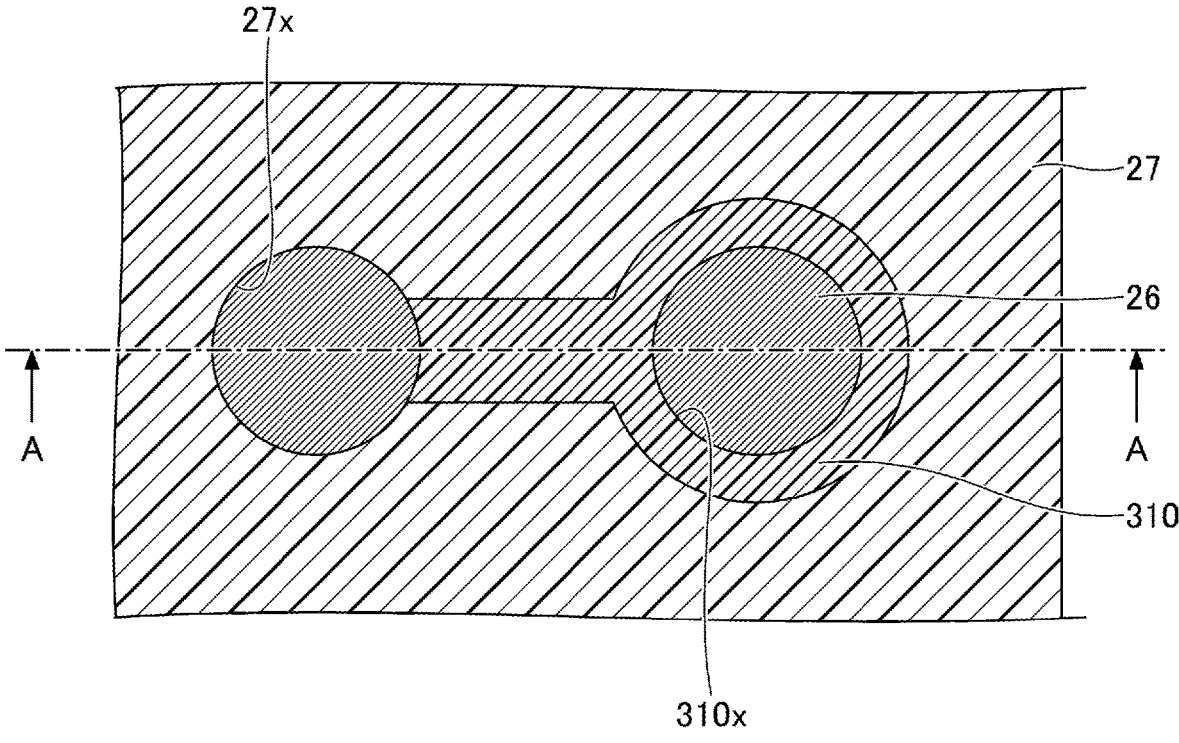
FIG. 4A and FIG. 4B are diagrams (part 3) illustrating an example of the manufacturing processes of the wiring board according to the first embodiment.
Figure 4B:
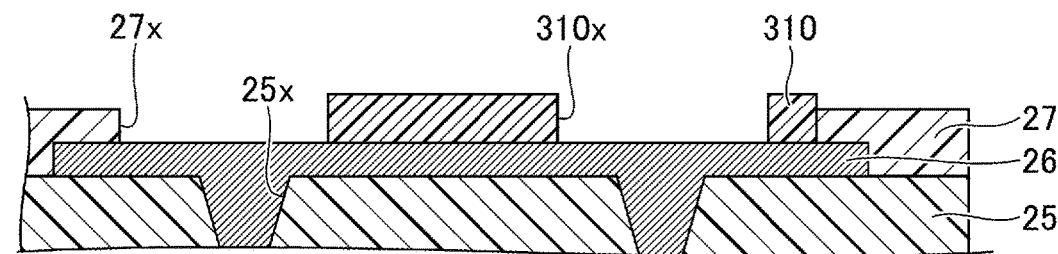

More particularly, as illustrated in FIG. 4A and FIG. 4B, for example, a resist layer 310 having openings 310x that expose a first region and a second region where the plating layer 28 is to be formed, is formed on the second surface (upper surface) of the interconnect layer 26 exposed inside the openings 27x of the solder resist layer 27. The method of forming the resist layer 310 and the openings 310x is the same as the method of forming the resist layer 300 and the holes 300x, for example.

Figure 5A:
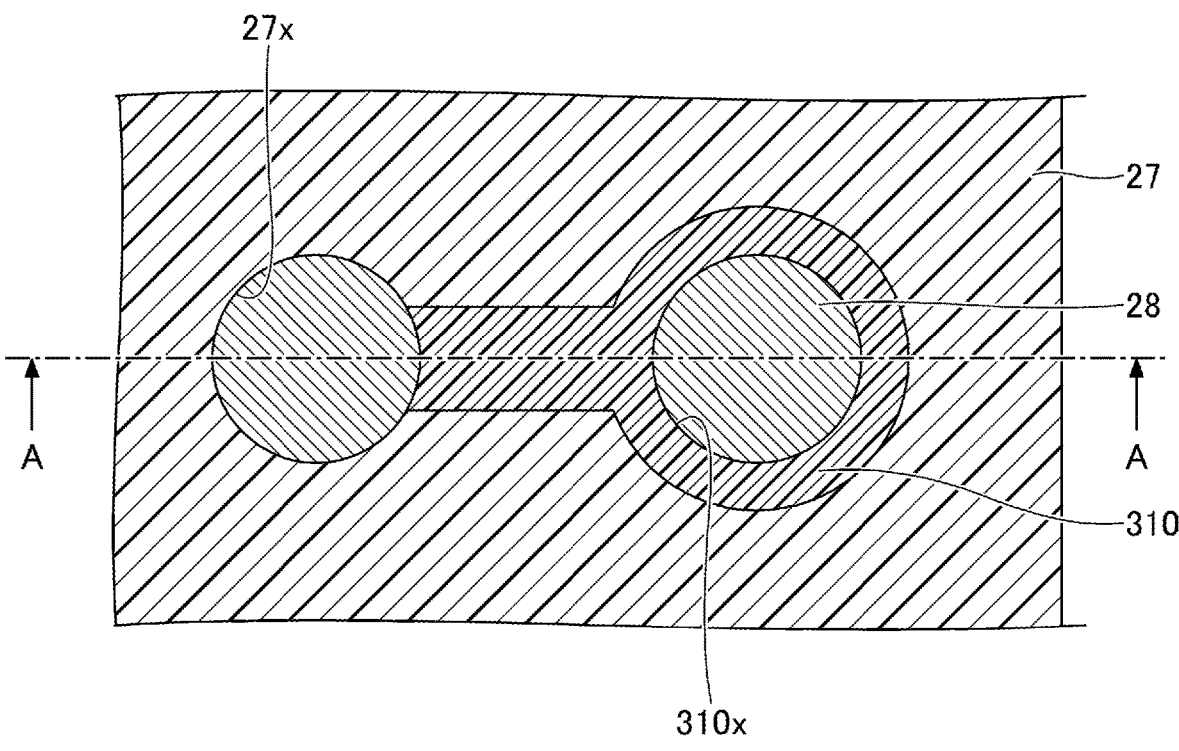
FIG. 5A and FIG. 5B are diagrams (part 4) illustrating an example of the manufacturing processes of the wiring board according to the first embodiment.
Figure 5B:
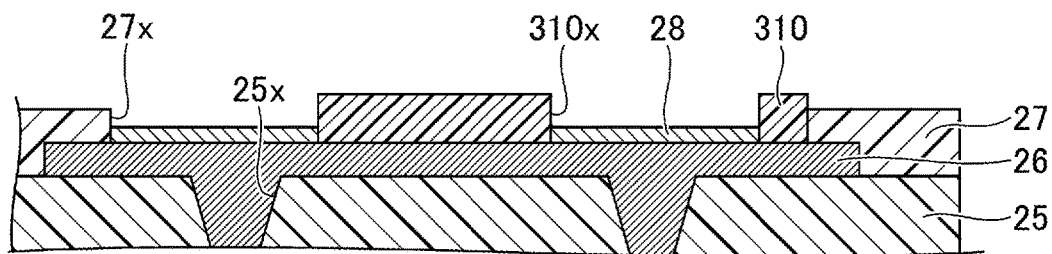

Next, as illustrated in FIG. 5A and FIG. 5B, the plating layer 28 is formed on the first region and the second region exposed inside the openings 310x of the resist layer 310. The plating layer 28 can be formed on the second surface (upper surface) of the interconnect layer 26 exposed inside the openings 310x of the resist layer 310 by electrolytic plating which supplies power from the interconnect layer 26, for example. The plating layer 28 may be formed by electroless plating. The plating layer 28 may be a single-layer metal layer or a multi-layer metal layer, as described above.

Figure 6A:
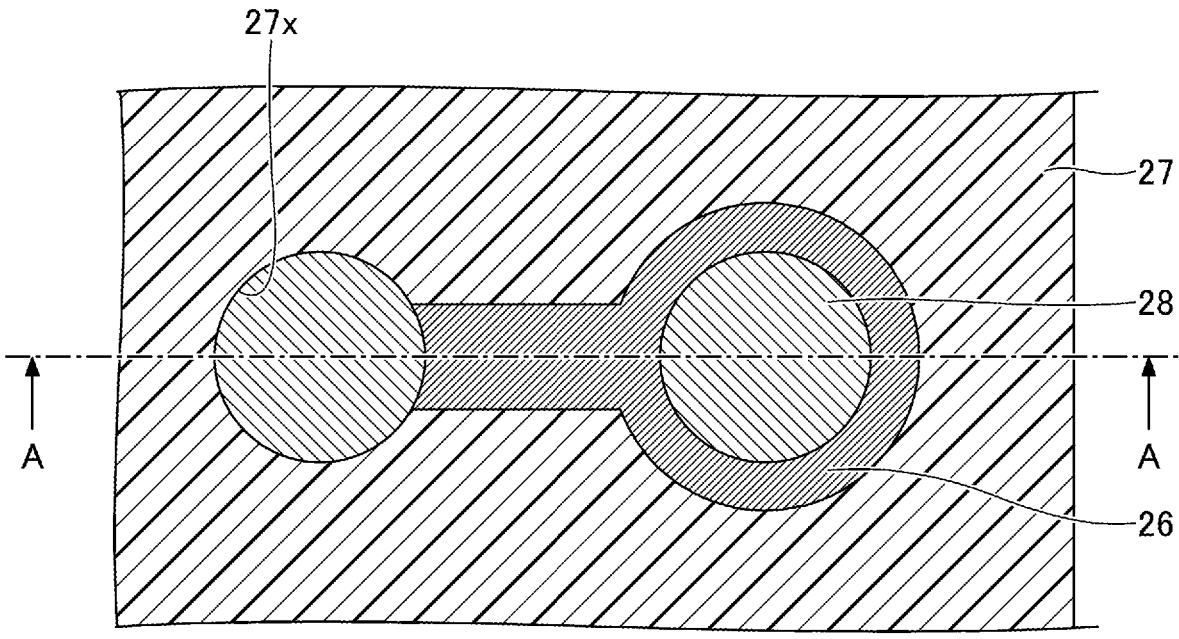
FIG. 6A and FIG. 6B are diagrams (part 5) illustrating an example of the manufacturing processes of the wiring board according to the first embodiment.
Figure 6B:
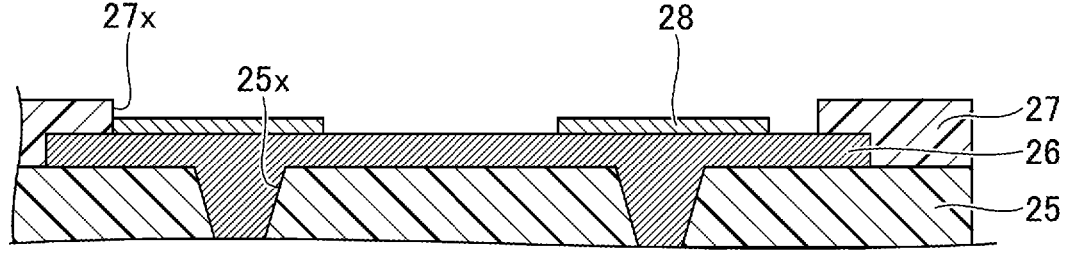

Next, as illustrated in FIG. 6A and FIG. 6B, the resist layer 310 is removed. The resist layer 310 can be removed by using a stripping agent, for example. Hence, the plating layer 28 is formed on the mutually independent first and second regions of the second surface (upper surface) of the interconnect layer 26 exposed inside the openings 27x of the solder resist layer 27.

Figure 7A:
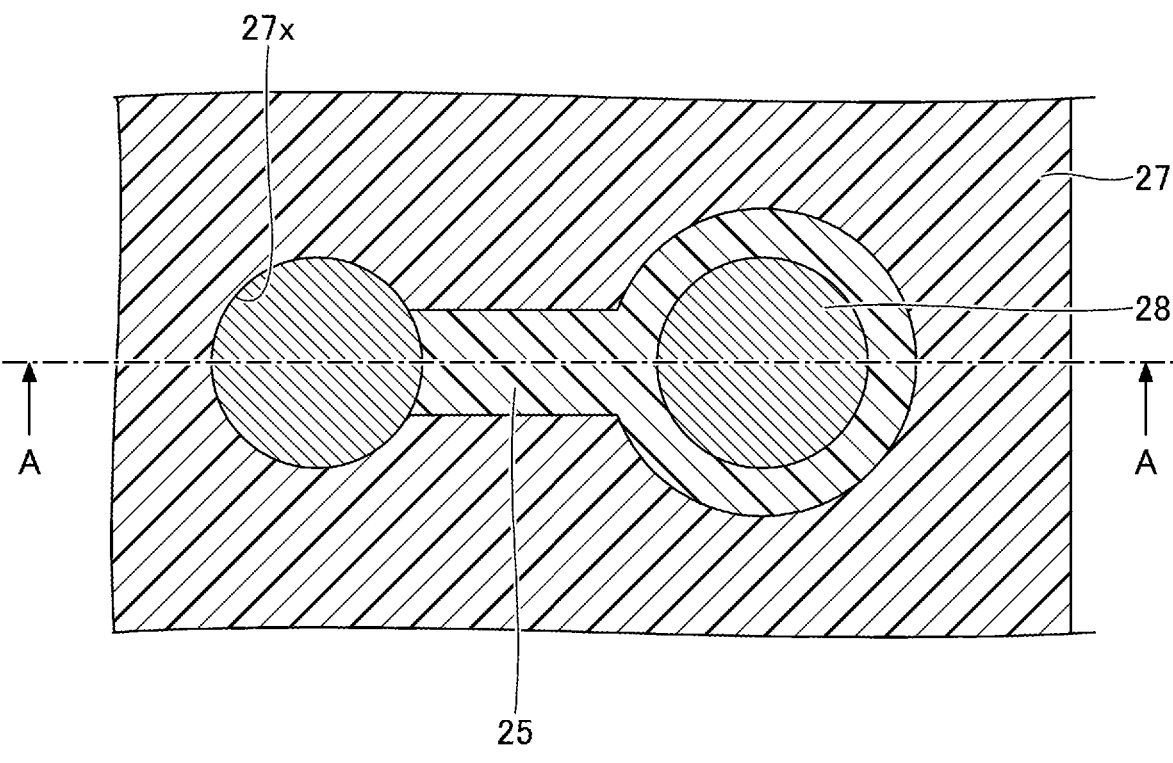
FIG. 7A and FIG. 7B are diagrams (part 6) illustrating an example of the manufacturing processes of the wiring board according to the first embodiment.
Figure 7B:
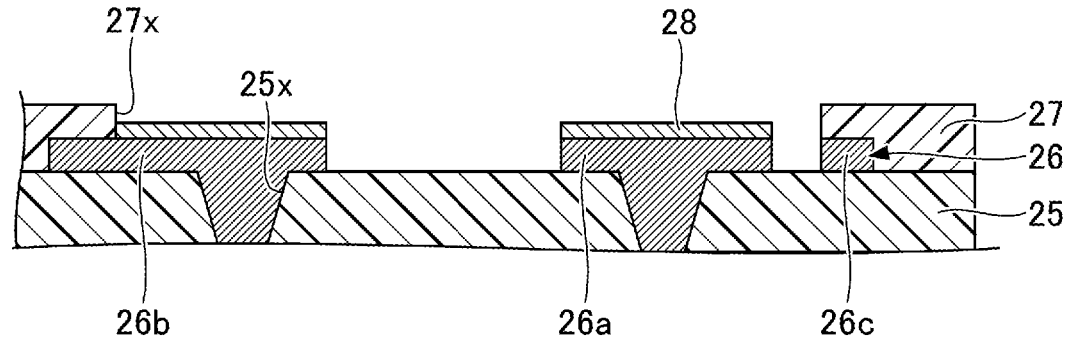

Next, in the process (or step) illustrated in FIG. 7A and FIG. 7B, the interconnect layer 26 exposed from the plating layer 28 is removed by etching, using the plating layer 28 as a mask. Thus, the first region and the second region are separated, the first pad 26a for external connection including the first region, the second pad 26b for external connection including the second region, and the interconnect 26c are formed. The first pad 26a is formed to include the portion opposing the second pad 26b, without the solder resist layer 27 interposed between the opposing portion of the first pad 26a and the second pad 26b. In a case where the interconnect layer 26 is a copper layer, an aqueous solution that is a mixture of sulfuric acid and hydrogen peroxide, a sodium persulfate aqueous solution, an ammonium persulfate aqueous solution, or the like can be used as an etchant, for example. In this case, the plating layer 28 formed of the Ni layer, the Pd layer, the Au layer, or the like is not removed by the etchant for etching the copper layer.

Next, the technical significance of the wiring board 1 will be described, with reference to a comparative example.

Figure 8A:
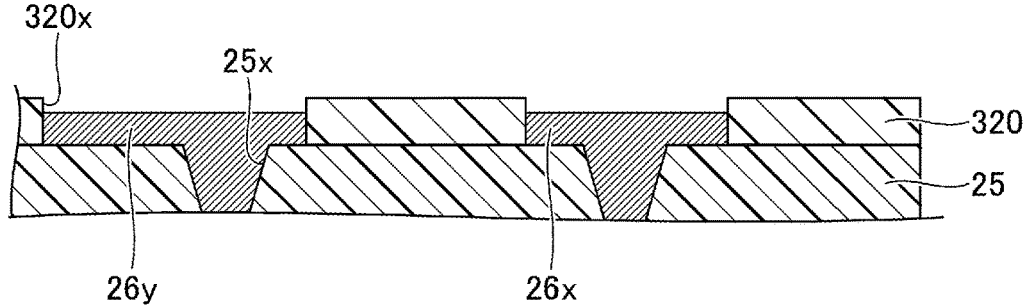
FIG. 8A, FIG. 8B, FIG. 8C, and FIG. 8D are diagrams for explaining an example of a part of manufacturing process of a wiring board according to a comparative example.
Figure 8B:
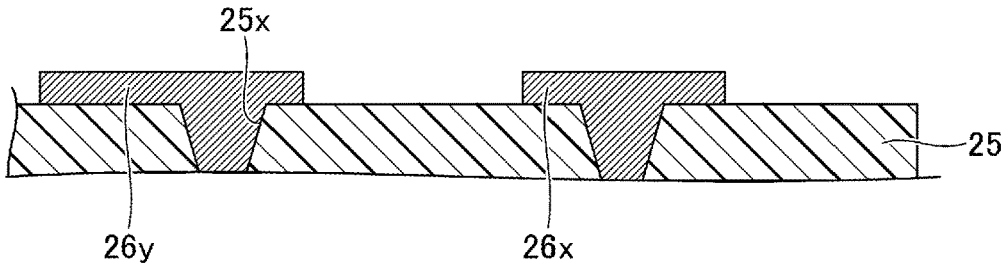

FIG. 8A and FIG. 8B are diagrams illustrating a part of a manufacturing process of a wiring board according to a comparative example. In this example, processes (or steps) of forming a first pad 26x, a second pad 26y, a solder resist layer 27, and a plating layer 28A on the wiring board already having the insulating layer 25 laminated thereon, will be described.

First, in the process (or step) illustrated in FIG. 8A, the via holes 25x are formed in the insulating layer 25, and the first pad 26x and the second pad 26y are thereafter formed on the insulating layer 25. More particularly, after forming the via holes 25x by laser beam machining, a resist layer 320 having holes 320x for exposing regions where the first pad 26x and the second pad 26y are to be formed, is formed on the upper surface of the insulating layer 25. The methods of forming the resist layer 320 and the holes 320x are the same as the methods of forming the resist layer 300 and the holes 300x, for example. The first pad 26x and the second pad 26y can be formed inside the via holes 25x and on the upper surface of the insulating layer 25 exposed inside the holes 320x by a known semi-additive method, for example. Next, in the process (or step) illustrated in FIG. 8B, the resist layer 320 is stripped.

Figure 8C:
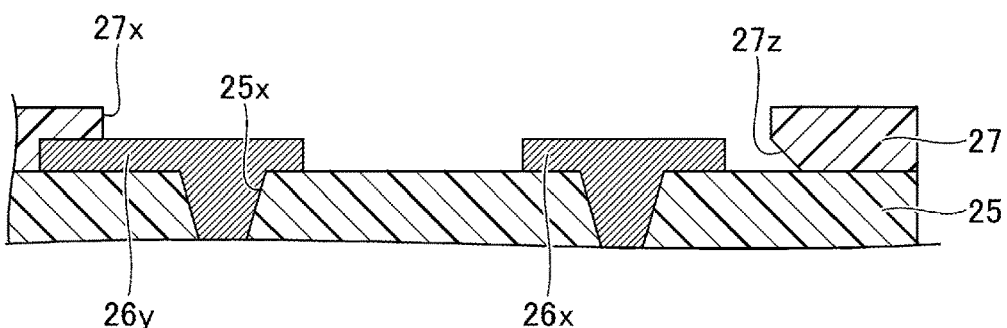

Next, in the process (or step) illustrated in FIG. 8C, the solder resist layer 27 including the openings 27x that selectively expose upper surfaces of the first pad 26x and the second pad 26y is formed on the insulating layer 25, similar to the process (or step) illustrated in FIG. 3A and FIG. 3B. The first pad 26x has the NSMD structure, and the second pad 26y has the SMD structure. In this process (or step), a part of the inner wall surface defining the openings 27x of the solder resist layer 27 makes contact with the insulating layer 25. In order to form the openings 27x so that the inner wall surface defining the openings 27x makes contact with the insulating layer 25, it is necessary to expose the solder resist layer 27 to a deep portion thereof. However, the deep portion of the solder resist layer 27 is not easily exposed to light and is not easily cured, and thus, the deep portion is easily scraped during development. For this reason, as illustrated in FIG. 8C, an undercut 27z may be formed in the part of the inner wall surface defining the opening 27x making contact with the insulating layer 25. But when the undercut 27z is formed, the solder resist layer 27 may be stripped from the undercut 27z. The deep portion of the solder resist layer 27 refers to a portion lower than the height of the upper surface of each of the first pad 26x and the second pad 26y with reference to the upper surface of the insulating layer 25.

Figure 8D:
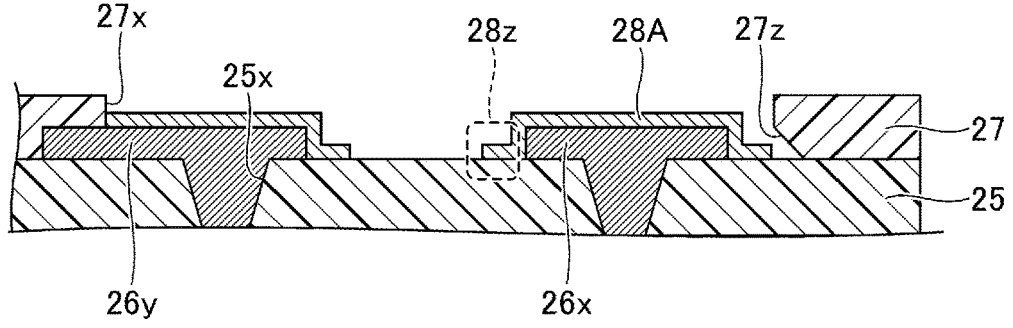

Next, in the process (or step) illustrated in FIG. 8D, a plating layer 28A is formed on the first pad 26x and the second pad 26y exposed inside the openings 27x of the solder resist layer 27. The plating layer 28A may be formed by electroless plating using the same material as the plating layer 28, for example. In a state before the plating layer 28A is formed in FIG. 8C, the upper surface and the side surface of each of the first pad 26x and the second pad 26y are partially exposed inside the openings 27x of the solder resist layer 27. For this reason, the plating layer 28A is formed not only on the upper surface of each of the first pad 26x and the second pad 26y exposed inside the openings 27x of the solder resist layer 27, but also on the side surface of each of the first pad 26x and the second pad 26y exposed inside the openings 27x of the solder resist layer 27. Further, the plating layer 28A extends from the side surface of each of the first pad 26x and the second pad 26y to the upper surface of the insulating layer 25 to form an extending portion 28z. A length of the extending portion 28z is approximately 10 μm, for example. As a result, an interval between the first pad 26x and the second pad 26y that are adjacent to each other is substantially reduced, thereby reducing a HAST resistance, and increasing the possibility of generating an insulating failure. The HAST resistance refers to the resistance with respect to a highly accelerated temperature and humidity stress test (HAST). The HAST test is one of environmental tests prescribed by IEC68-2-66.

In contrast, in the wiring board 1, the plating layer 28 is formed on the interconnect layer 26, before the interconnect layer 26 is etched to form the first pad 26a and the second pad 26b. For this reason, the plating layer 28 is not formed on the side surface of each of the first pad 26a and the second pad 26b. Hence, in the wiring board 1, the extending portion 28z illustrated in FIG. 8D is not formed, and thus, the interval between the first pad 26a and the second pad 26b that are adjacent to each other will not be substantially narrowed by the extending portion 28z. As a result, the wiring board 1 has an improved HAST resistance and can maintain excellent insulation properties compared to the wiring board according to the comparative example. The wiring board 1 is particularly effective in improving the HAST resistance and maintaining the excellent insulation properties in a case where the interval between the first pad 26a and the second pad 26b is small.

In the wiring board 1, the first pad 26a and the second pad 26b are formed by etching the interconnect layer 26 after the solder resist layer 27 is formed. For this reason, the inner wall surface defining the openings 27x of the solder resist layer 27 is separated from the insulating layer 25 and does not make contact with the upper surface of the insulating layer 25. That is, when forming the openings 27x, it is not necessary to expose a deep portion of the solder resist layer 27. Hence, the undercut 27z illustrated in FIG. 8C is less likely to be formed, and the possibility of the solder resist layer 27 becoming stripped can be reduced.

Modifications of First Embodiment

In modifications of the first embodiment, examples of the wiring board having pad structures different from that of the first embodiment will be described. In the modifications of the first embodiment, those constituent elements that are the same as those corresponding constituent elements of the first embodiment are designated by the same reference numerals, and a repeated description of the same constituent elements may be omitted.

Figure 9A:
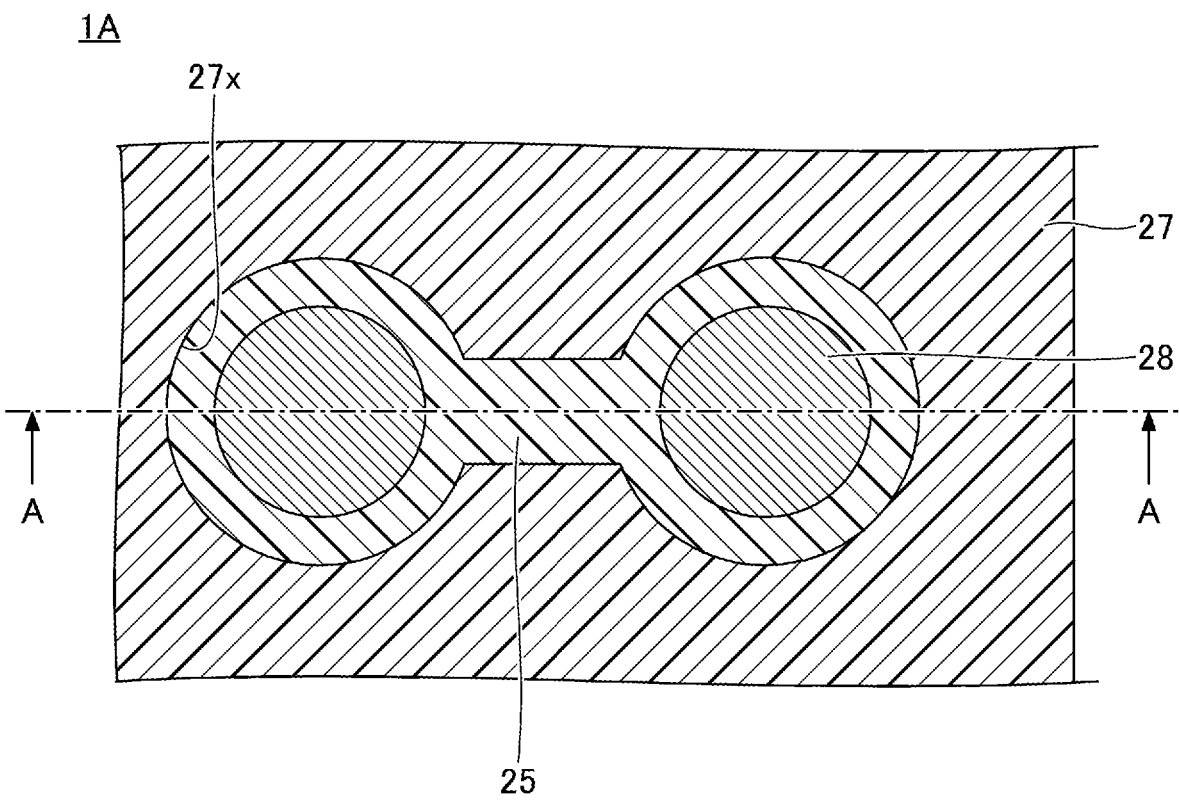
FIG. 9A and FIG. 9B are diagrams illustrating an example of the wiring board according to a first modification of the first embodiment.
Figure 9B:
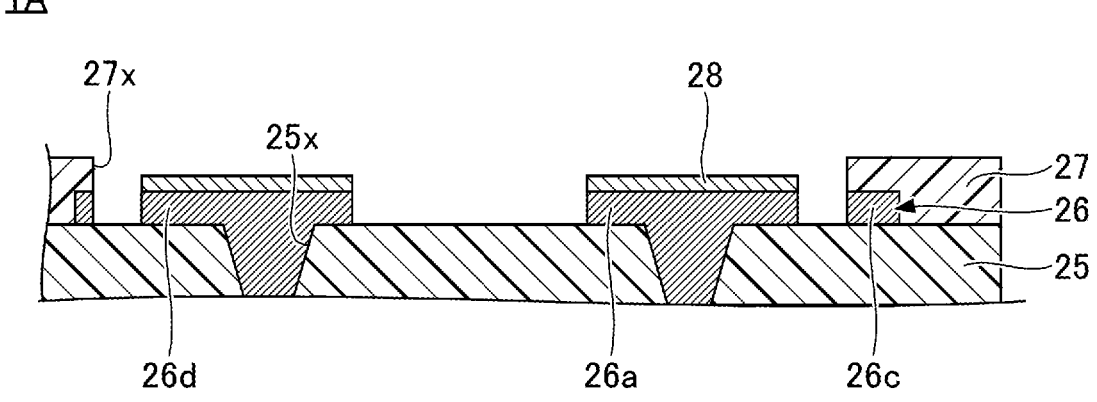
Figure 10A:
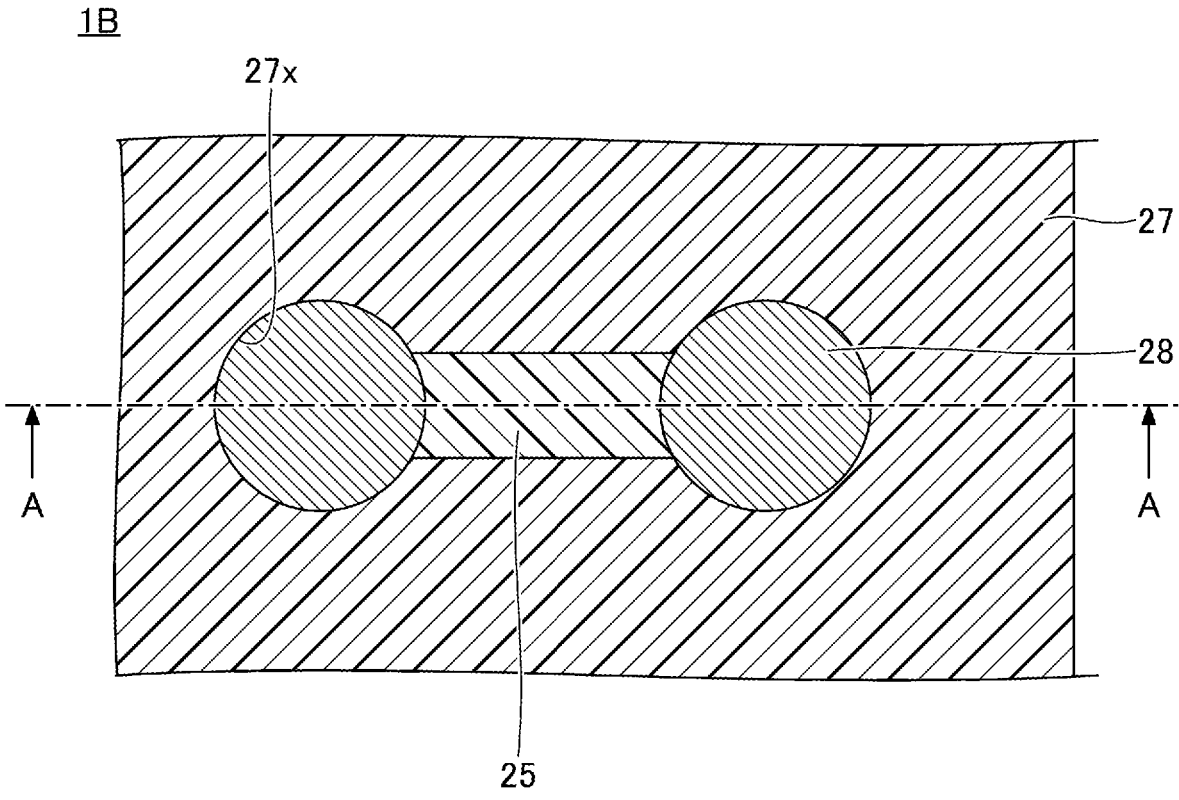
FIG. 10A and FIG. 10B are diagrams illustrating an example of the wiring board according to a second modification of the first embodiment.
Figure 10B:
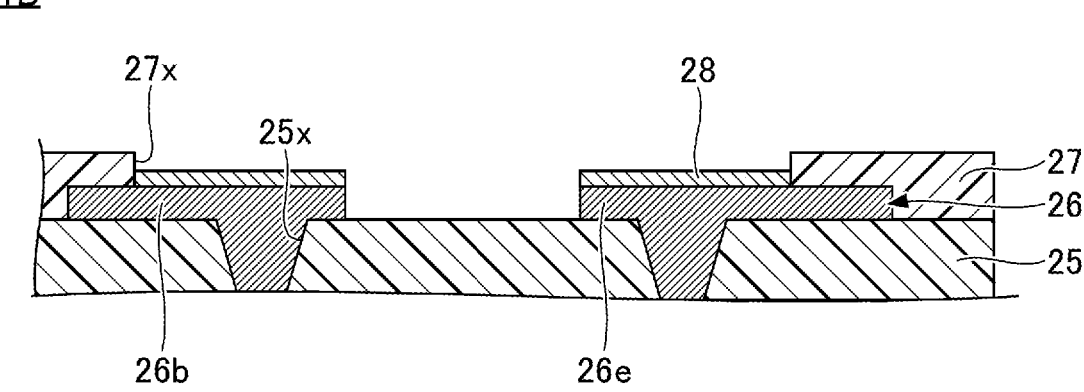
Figure 11A:
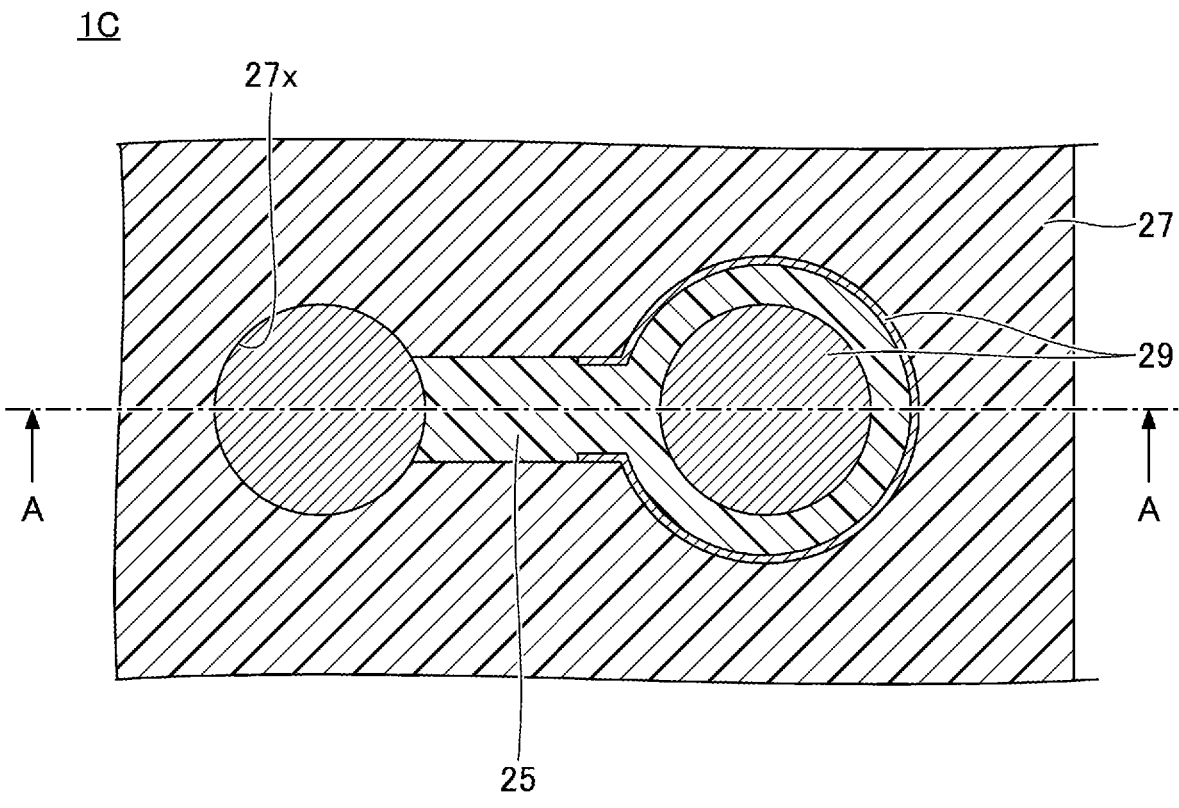
FIG. 11A and FIG. 11B are diagrams illustrating an example of the wiring board according to a third modification of the first embodiment.
Figure 11B:
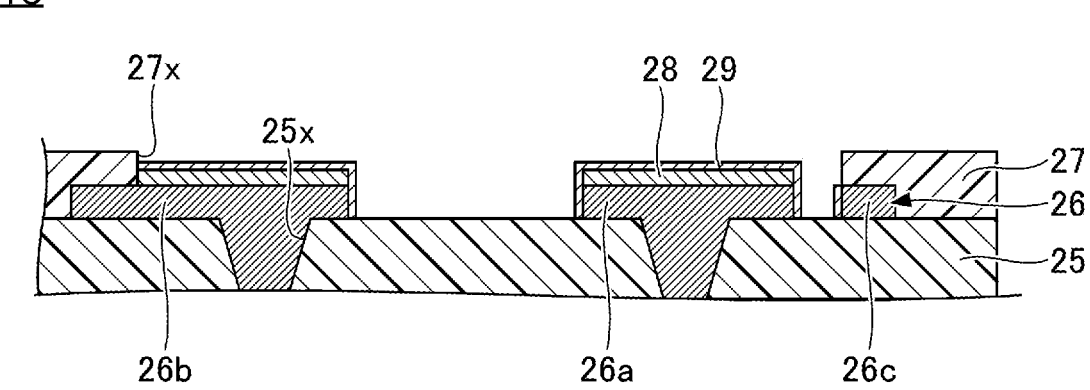

FIG. 9A and FIG. 9B are diagrams illustrating an example of the wiring board according to a first modification of the first embodiment. FIG. 10A and FIG. 10B are diagrams illustrating an example of the wiring board according to a second modification of the first embodiment. FIG. 11A and FIG. 11B are diagrams illustrating an example of the wiring board according to a third modification of the first embodiment. FIG. 9A, FIG. 10A, and FIG. 11A are plan views corresponding to the region P in FIG. 1, and FIG. 9B, FIG. 10B, and FIG. 11B are cross sectional views taken along a line A-A in FIG. 9A, FIG. 10A, and FIG. 11A, respectively. Although FIG. 9A, FIG. 10A, and FIG. 11A are plan views, hatchings corresponding to the cross sectional views of FIG. 9B, FIG. 10B, and FIG. 11B are illustrated for the sake of convenience to facilitate understanding of corresponding constituent elements.

As illustrated in FIG. 9A and FIG. 9B, a wiring board 1A differs from the wiring board 1 in that the second pad 26b is replaced with a second pad 26d. The first pad 26a and the second pad 26d both have the NSMD structure. That is, the second surface (upper surface) and the side surface of each of the first pad 26a and the second pad 26d are entirely exposed from the solder resist layer 27. The regions of the second surface (upper surface) of each of the first pad 26a and the second pad 26d exposed from the solder resist layer 27 are covered with the plating layer 28. Further, the regions of the side surface of each of the first pad 26a and the second pad 26d exposed from the solder resist layer 27 are exposed from the plating layer 28. Such a structure also provides the same effects as the wiring board 1.

As illustrated in FIG. 10A and FIG. 10B, a wiring board 1B differs from the wiring board 1 in that the first pad 26a is replaced with a first pad 26e. The first pad 26e and the second pad 26b both have the SMD structure. That is, the second surface (upper surface) and the side surface of each of the first pad 26e and the second pad 26b are partially covered with the solder resist layer 27. The regions of the second surface (upper surface) of each of the first pad 26e and the second pad 26b exposed from the solder resist layer 27 are covered with the plating layer 28. Further, the regions of the side surface of each of the first pad 26e and the second pad 26b exposed from the solder resist layer 27 are exposed from the plating layer 28. Such a structure also provides the same effects as the wiring board 1.

As illustrated in FIG. 11A and FIG. 11B, a wiring board 1C differs from the wiring board 1 in that the wiring board 1C further includes a surface-treated layer 29. The surface-treated layer 29 covers the upper surface and the side surface of the plating layer 28 exposed from the solder resist layer 27, and also covers the side surface of each of the first pad 26a and the second pad 26b, and the side surface of the interconnect 26c exposed from the solder resist layer 27.

The surface-treated layer 29 may be a single-layer metal layer or a multi-layer metal layer described above as examples of the surface-treated layer in the first embodiment. Alternatively, an organic coating film formed by the OSP treatment or the like may be used as the surface-treated layer 29. The surface-treated layer 29 may have the same configuration as the plating layer 28. For example, in a case where the plating layer 28 is a Ni/Pd/Au layer, the surface-treated layer 29 may be a Ni/Pd/Au layer. The surface-treated layer 29 is thinner than the plating layer 28. A thickness of the surface-treated layer 29 is preferably in a range of approximately 1/10 to approximately 1/5 the thickness of the plating layer 28, for example.

In order to form the surface-treated layer 29, a process (or step) of forming the surface-treated layer 29 thinner than the plating layer 28 may further be provided after the process (or step) illustrated in FIG. 7A and FIG. 7B. In this process (or step), the surface-treated layer 29 is formed by electroless plating or the like to cover the surface of the plating layers 28 exposed from the solder resist layer 27 and to cover the side surface of each of the first pad 26a and the second pad 26b and the region of the side surface of the interconnect 26c exposed from the solder resist layer 27.

Accordingly, the surface-treated layer 29 covers the side surface of each of the first pad 26a and the second pad 26b and the region of the side surface of the interconnect 26c exposed from the solder resist layer 27. This coverage of the surface-treated layer 29 prevents corrosion (oxidation or the like) of the side surface of each of the first pad 26a and the second pad 26b and the side surface of the interconnect 26c. Because the surface-treated layer 29 is considerably thinner than the plating layer 28, an extending portion, such as the extending portion 28z illustrated in FIG. 8D, is not formed in the wiring board 1C. For this reason, the presence of the surface-treated layer 29 does not deteriorate the HAST resistance.

According to the disclosed technique, it is possible to improve the HAST resistance of the wiring board.

Various aspects of the subject-matter described herein may be set out non-exhaustively in the following numbered clauses:

1. A method for manufacturing a wiring board, comprising:

forming on an insulating layer an interconnect layer including a first surface in contact with the insulating layer and a second surface opposite to the first surface;

forming a protective insulating layer on the insulating layer, so as to selectively expose the second surface of the interconnect layer;

forming a plating layer on mutually independent first and second regions of the second surface exposed from the protective insulating layer; and forming a first pad for external connection including the first region and a second pad for external connection including the second region, by etching and removing the interconnect layer exposed from the plating layer so as to separate the first region and the second region, wherein the first pad has a portion opposing the second pad without the protective insulating layer interposed between the opposing portion of the first pad and the second pad.

2. The method for manufacturing the wiring board according to clause 1, further comprising:

forming a resist layer, exposing the first region and the second region, on the second surface exposed from the protective insulating layer before the forming the plating layer, wherein the forming the plating layer forms the plating layer on the first region and the second region exposed from the resist layer, and the resist layer is removed after the forming the plating layer.

3. The method for manufacturing the wiring board according to clause 1 or 2, further comprising:

forming a surface-treated layer thinner than the plating layer after the forming the first pad and the second pad, wherein the surface-treated layer is formed to cover a surface of the plating layer exposed from the protective insulating layer, and to cover a region of the side surface of each of the first pad and the second pad exposed from the protective insulating layer.

Although the embodiments and the modifications are numbered with, for example, "first," "second," or "third," the ordinal numbers do not imply priorities of the embodiments and the modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, in the embodiments and the modifications described above, the present invention is applied to the pads on the side of the wiring board to be connected to the mother board or the like. However, the present invention may be applied to pads on the side of the wiring board to be connected to a semiconductor chip or the like. Alternatively, the present invention may be applied to both the pads on the side of the wiring board to be connected to the mother board or the like, and to the pads on the side of the wiring board to be connected to the semiconductor chip or the like.

What is claimed is:

1. A wiring board comprising:

an insulating layer;

a first pad and a second pad for external connection, provided on the insulating layer and including a first surface in contact with the insulating layer, a second surface opposite to the first surface, and a first side surface connecting the first surface and the second surface, respectively; and a protective insulating layer provided above the insulating layer, wherein:

each of the first pad and the second pad has a portion exposed inside an opening in the protective insulating layer, the first pad has a portion opposing the second pad without the protective insulating layer interposed between the opposing portion of the first pad and the second pad, a region of the second surface of each of the first pad and the second pad exposed from the protective insulating layer is covered with a plating layer, a region of the first side surface of each of the first pad and the second pad exposed from the protective insulating layer is exposed from the plating layer, and an inner wall surface defining the opening in the protective insulating layer is separated from the insulating layer.

2. The wiring board as claimed in claim 1, further comprising:

an interconnect including a third surface in contact with a surface of the insulating layer, a fourth surface opposite to the third surface and covered with the protective insulating layer, and a second side surface connecting the third surface and the fourth surface, the surface of the insulating layer is in contact with the first surface of each of the first pad and the second pad, and a portion of the second side surface is covered with the protective insulating layer, and a remaining portion of the second side surface is exposed from the inner wall surface defining the opening in the protective insulating layer.

3. The wiring board as claimed in claim 1, further comprising:

a surface-treated layer thinner than the plating layer, wherein the surface-treated layer covers a surface of the plating layer exposed from the protective insulating layer, and covers a region of the first side surface of each of the first pad and the second pad exposed from the protective insulating layer.

4. The wiring board as claimed in claim 1, wherein:

the second surface and the first side surface of the first pad are entirely exposed from the protective insulating layer, and the second surface and the first side surface of the second pad are partially covered with the protective insulating layer.

5. The wiring board as claimed in claim 1, wherein the second surface and the first side surface of each of the first pad and the second pad are entirely exposed from the protective insulating layer.

6. The wiring board as claimed in claim 1, wherein the second surface and the first side surface of at least one of the first pad and the second pad are partially covered with the protective insulating layer.

7. The wiring board as claimed in claim 2, wherein:

the inner wall surface defining the opening in the protective insulating layer makes no direct contact with the insulating layer, and the inner wall surface defining the opening in the protective insulating layer is in contact with at least one of the first pad, the second pad, or the interconnect.

* * * * *